(12) United States Patent
Lai et al.

(10) Patent No.: US 10,331,035 B2
(45) Date of Patent: Jun. 25, 2019

(54) LIGHT SOURCE FOR LITHOGRAPHY EXPOSURE PROCESS

(71) Applicant: Taiwan Semiconductor Manufacturing Co., Ltd., Hsinchu (TW)

(72) Inventors: Cheng-Hao Lai, Taichung (TW); Han-Lung Chang, Kaohsiung (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/002,180

(22) Filed: Jun. 7, 2018

(65) Prior Publication Data

US 2019/0137882 A1 May 9, 2019

Related U.S. Application Data

(60) Provisional application No. 62/583,052, filed on Nov. 8, 2017.

(51) Int. Cl.
*G03F 7/20* (2006.01)
*H05G 2/00* (2006.01)

(52) U.S. Cl.
CPC ...... *G03F 7/70033* (2013.01); *G03F 7/70025* (2013.01); *H05G 2/008* (2013.01)

(58) Field of Classification Search
CPC .... G03F 7/70033; H05G 2/008; H05G 2/005; H05G 2/006
See application file for complete search history.

(56) References Cited

U.S. PATENT DOCUMENTS

| 8,154,000 | B2 * | 4/2012 | Hergenhan | H05G 2/003 250/493.1 |
|---|---|---|---|---|
| 8,764,995 | B2 | 7/2014 | Chang et al. | |
| 8,796,666 | B1 | 8/2014 | Huang et al. | |
| 8,828,625 | B2 | 9/2014 | Lu et al. | |
| 8,841,047 | B2 | 9/2014 | Yu et al. | |
| 8,877,409 | B2 | 11/2014 | Hsu et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 2006/0192155 | A1 * | 8/2006 | Algots | H05G 2/003 250/504 R |

(Continued)

OTHER PUBLICATIONS

U.S. Appl. No. 15/632,500, filed Jun. 26, 2017.

*Primary Examiner* — Steven Whitesell Gordon
(74) *Attorney, Agent, or Firm* — McClure, Qualey & Rodack, LLP

(57) ABSTRACT

A method for generating a radiation light in a lithography exposure system. The method includes producing a predetermined gas pressure in a storage chamber to supply a first load of a target fuel in the storage chamber via a nozzle. The method further includes irradiating the target fuel from the nozzle with a laser to generate the radiation light. The method also includes increasing the gas pressure in a buffer chamber which receives a second load of target fuel to the predetermined gas pressure. In addition, the method includes actuating the flow of the target fuel from the buffer chamber to the storage chamber.

20 Claims, 11 Drawing Sheets

(56) References Cited

U.S. PATENT DOCUMENTS

| | | | | |
|---|---|---|---|---|
| 2008/0067456 A1* | 3/2008 | Kloepfel | ................ | H05G 2/003 250/504 R |
| 2010/0213272 A1* | 8/2010 | Yabu | ................... | G03F 7/70033 239/102.1 |
| 2010/0213275 A1* | 8/2010 | Ishihara | ................ | H05G 2/003 239/102.2 |
| 2011/0284774 A1* | 11/2011 | Ishihara | ................ | H05G 2/003 250/504 R |
| 2012/0292527 A1* | 11/2012 | Fomenkov | .............. | B22F 3/105 250/432 R |
| 2013/0134326 A1* | 5/2013 | Yabu | ...................... | H05G 2/003 250/455.11 |
| 2013/0221587 A1* | 8/2013 | Shiraishi | ................. | C22B 9/00 266/200 |
| 2014/0008552 A1* | 1/2014 | Umeda | ............... | G03F 7/70033 250/504 R |
| 2014/0261761 A1* | 9/2014 | Vaschenko | ............ | H05G 2/005 137/334 |
| 2015/0055106 A1* | 2/2015 | Dijksman | ............... | H05G 2/006 355/67 |
| 2016/0377986 A1* | 12/2016 | Shiraishi | ............... | H01L 21/027 355/67 |
| 2017/0053780 A1* | 2/2017 | Iwamoto | ................. | H05G 2/00 |

\* cited by examiner

LIGHT SOURCE FOR LITHOGRAPHY EXPOSURE PROCESS

PRIORITY CLAIM AND CROSS-REFERENCE

This application claims the benefit of U.S. Provisional Application No. 62/583,052, filed on Nov. 8, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 800 nm. One type of EUV light source is laser-produced plasma (LPP). LPP technology produces EUV light by focusing a high-power laser onto small fuel droplet targets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
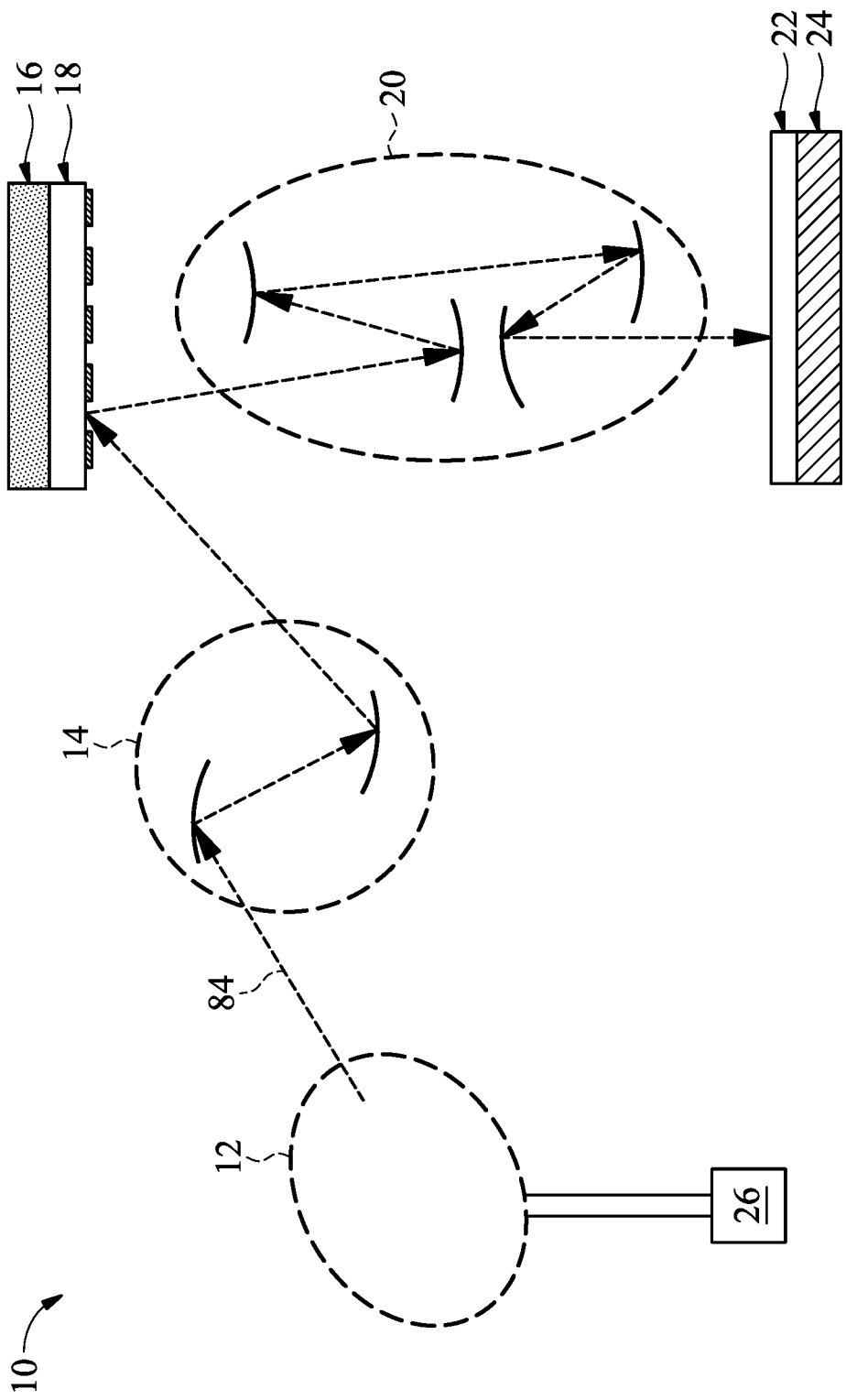
FIG. 1 is a schematic view of a lithography exposure system with a light source, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a lithography exposure system 10, in accordance with some embodiments. The lithography exposure system 10 may also be generically referred to as a scanner that is operable to perform lithography exposing processes with respective radiation source and exposure mode.

The lithography exposure system 10 includes a light source 12, an illuminator 14, a mask stage 16, a projection optics module (or projection optics box (POB)) 20 and a substrate stage 24, in accordance with some embodiments. The elements of the lithography exposure system 10 can be added to or omitted, and the invention should not be limited by the embodiment.

The light source 12 is configured to generate radians having a wavelength ranging between about 1 nm and about 100 nm in certain embodiments. In one particular example, the light source 12 generates an EUV light with a wavelength centered at about 13.5 nm. Accordingly, the light source 12 is also referred to as an EUV light source. However, it should be appreciated that the light source 12 should not be limited to emitting EUV light. The light source 12 can be utilized to perform any high-intensity photon emission from excited target fuel.

In various embodiments, the illuminator 14 includes various refractive optic components, such as a single lens or a lens system having multiple lenses (zone plates) or alternatively reflective optics (for EUV lithography exposure system), such as a single mirror or a mirror system having multiple mirrors in order to direct light from the light source 12 onto the mask stage 16, particularly to a mask 18 secured on the mask stage 16. In the present embodiment where the light source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography exposure system for the EUV lithography patterning is maintained in a vacuum environment to avoid EUV intensity loss. In the present disclosure, the terms mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or projection optics box (POB)) 20 is configured for imaging the pattern of the mask 18 on to a semiconductor wafer 22 secured on the substrate stage 24 of the lithography exposure system 10. In some embodiments, the POB 20 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 20. The illuminator 14 and the POB 20 are collectively referred to as an optical module of the lithography exposure system 10.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography exposure system 10 may further include other modules or be integrated with (or be coupled with) other modules. In the present embodiment, the lithography exposure system 10 includes a cleaning module 26 designed to provide hydrogen gas to the light source 12. The hydrogen gas helps reduce contamination in the light source 12.

Figure 2:
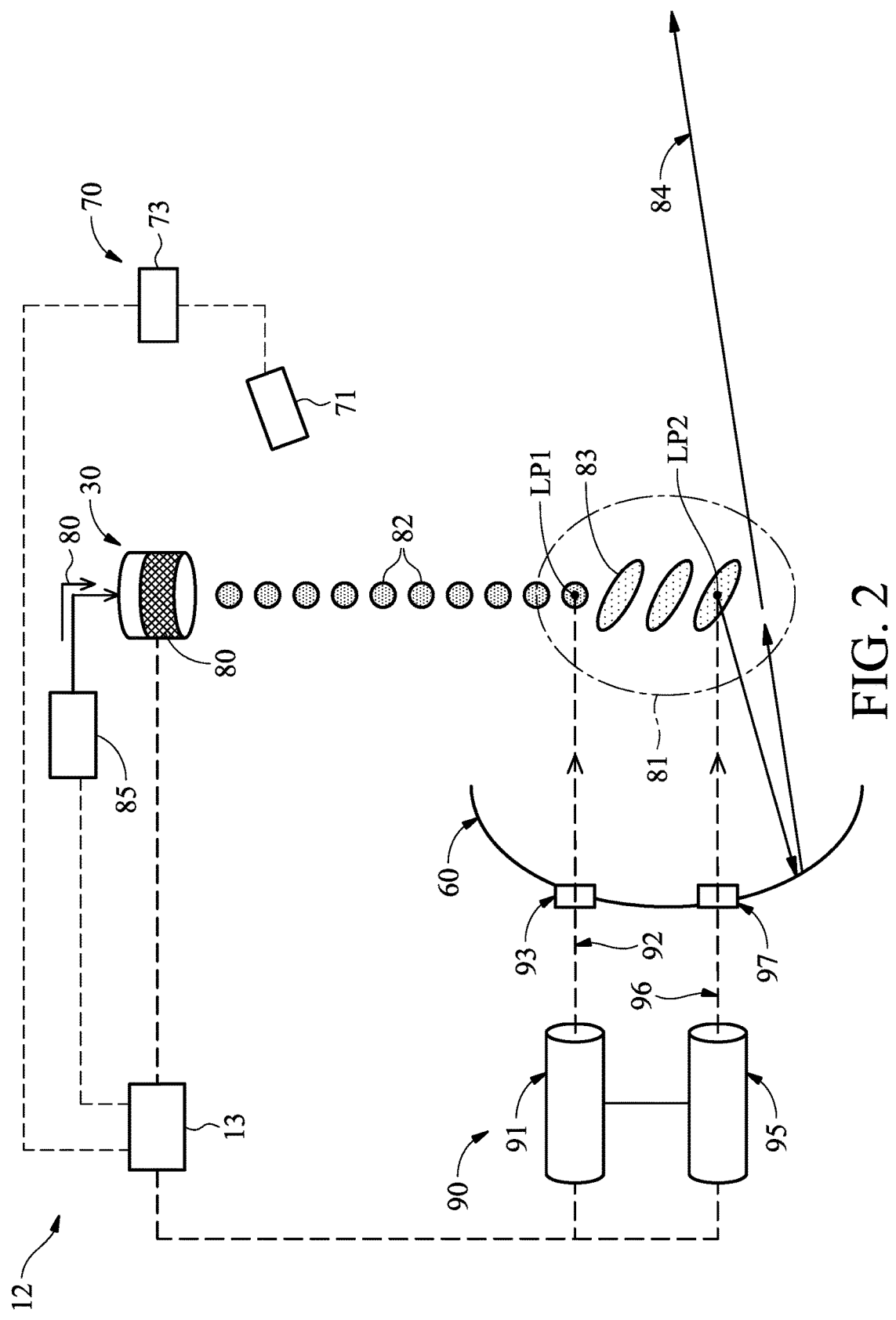
FIG. 2 is a schematic view of the light source in the lithography exposure system of FIG. 1, in accordance with some embodiments.

FIG. 2 illustrates the light source 12 in a diagrammatical view, in accordance with some embodiments. In some embodiments, the light source 12 employs a dual-pulse laser produced plasma (LPP) mechanism to generate plasma and further generate EUV light from the plasma. The light source 12 includes a controller 13, a target fuel generator 30, a laser generator 90, a laser produced plasma (LPP) collector 60, a monitoring device 70 and a fuel source 85. The above-mentioned elements of the light source 12 may be held under vacuum. It should be appreciated that the elements of the light source 12 can be added to or omitted, and the invention should not be limited by the embodiment.

The target fuel generator 30 is configured to generate a plurality of droplets 82 of a target fuel 80 into a zone of excitation 81. In an embodiment, the target fuel 80 includes tin (Sn). In an embodiment, the droplets 82 each have a diameter about 30 microns (μm). In an embodiment, the droplets 82 are generated at a rate about 50 kilohertz (kHz) and are introduced into the zone of excitation 81 in the light source 12 at a speed about 70 meters per second (m/s). Other material can also be used for the target fuel 80, for example, a tin containing liquid material such as eutectic alloy containing tin, lithium (Li), and xenon (Xe). The target fuel 80 receiving in the target fuel generator 30 may be in a liquid phase. The structural features of the target fuel generator 30 will be described in more details in relation to FIG. 3.

The laser generator 90 is configured to generate at least one laser to allow the conversion of the droplets 82 into plasma. In some embodiments, the laser generator 90 includes a first laser source 91 and a second laser source 95. The first laser source 91 is configured to produce a pre-pulse laser 92. The second laser source 95 is configured to produce a main pulse laser 96. The pre-pulse laser 92 is used to heat (or pre-heat) the droplets 82 to expand the droplets 82, which is subsequently irradiated by the main pulse laser 96, generating increased emission of light. In an embodiment, the first laser source 91 is a carbon dioxide ($CO_2$) laser source. In another embodiment, the first laser source 91 is a neodymium-doped yttrium aluminum garnet (Nd:YAG) laser source. In an embodiment, the second laser source 95 is a $CO_2$ laser source.

In the present embodiment, the pre-pulse laser 92 has less intensity and a smaller spot size than the main pulse laser 96. In various embodiments, the pre-pulse laser 92 has a spot size of about 100 μm or less, and the main pulse laser 96 has a spot size about 200-300 μm, such as 225 μm. The pre-pulse laser 92 and the main pulse laser 96 are generated to have certain driving powers to meet wafer production targets, such as a throughput of 125 wafers per hour. For example, the pre-pulse laser 92 is equipped with about 2 kilowatts (kW) driving power, and the main pulse laser 96 is equipped with about 19 kW driving power. In various embodiments, the total driving power of the pre-pulse laser 92 and the main pulse laser 96 is at least 20 kW, such as 27 kW. However, it should be appreciated that many variations and modifications can be made to embodiments of the disclosure.

The pre-pulse laser 92 and main pulse laser 96 are directed through windows (or lenses) 93 and 97, respectively, into the zone of excitation 81 and irradiate droplets 82 at a first lighting position LP1 and a second lighting position LP2. The windows 93 and 97 adopt a suitable material substantially transparent to the respective lasers. The method for exciting the droplets 82 supplied by the target fuel generator 30 is described later.

The monitoring device 70 is configured to monitor the condition of the droplets 82 supplied by the target fuel generator 30. In some embodiments, the monitoring device 70 includes a droplet condition detector 71 and an analyzer 73. The droplet condition detector 71 may include an image sensor, such as charge coupled device, CCD or complementary metal oxide semiconductor sensor, CMOS sensor, etc. The droplet condition detector 71 produces a monitoring image including image or video of the droplets 82 and transmits the monitoring image to the analyzer 73.

The analyzer 73 is configured to analyze signals produced by the droplet condition detector 71 and outputs a detection signal to the controller 13 according to an analyzing result. For example, the analyzer 73 includes an image analyzer. The analyzer 73 receives the data associated with the images transmitted from the droplet condition detector 71 and performs an image-analysis process on the images of the droplets 82 in the excitation zone 81. Afterwards, the analyzer 73 sends data related to the analysis to the controller 13. The analysis may include a flow path error or a position error.

It should be appreciated that, while there is only one monitoring device 70 arranged for monitoring the droplets 82, many variations and modifications can be made to embodiments of the disclosure. In some other embodiments, there are two monitoring devices 70 used to monitor the droplets 82. One of the monitoring devices 70 is used to monitor the condition of the droplets 82 which have not been hit by the pre-pulse laser 92. The other monitoring device 70 is used to monitor droplets 82 that have been hit by the pre-pulse laser 92.

The controller 13 is configured to control one or more elements of the light source 12. In some embodiments, the controller 13 is configured to drive the target fuel generator 30 to generate the droplets 82 (a process that will be described in more detail in relation to the method S10 shown in FIG. 4). In addition, the controller 13 is configured to drive the first laser source 91 and the second laser source 95 to fire the pre-pulse laser 92 and the main pulse laser 96. The generation of the pre-pulse laser 92 and the main pulse laser 96 may be controlled to be associated with the generation of droplets 82 by the controller 13 so as to make the pre-pulse laser 92 and the main pulse laser 96 hit each target 82 in sequence.

The controller 13 may be a computer system. In one example, the computer system includes a network communications device or a network computing device (for example, a mobile cellular phone, a laptop, a personal computer, a network server, etc.) capable of communicating with a network. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM), or another static storage device, for storing data and/or instructions to be executed by the processor. For example, the system memory component may store the predetermined value of the flow velocity of the targets; the predetermined value of the period of time during an individual target passes two detection position; the predetermined value of the temperature in the target fuel generator 30; the predetermined value of the gas pressure in the target fuel generator 30 and/or an acceptable range for the parameters of the laser generator.

The target fuel generator 30 is discussed further below.

Figure 3:
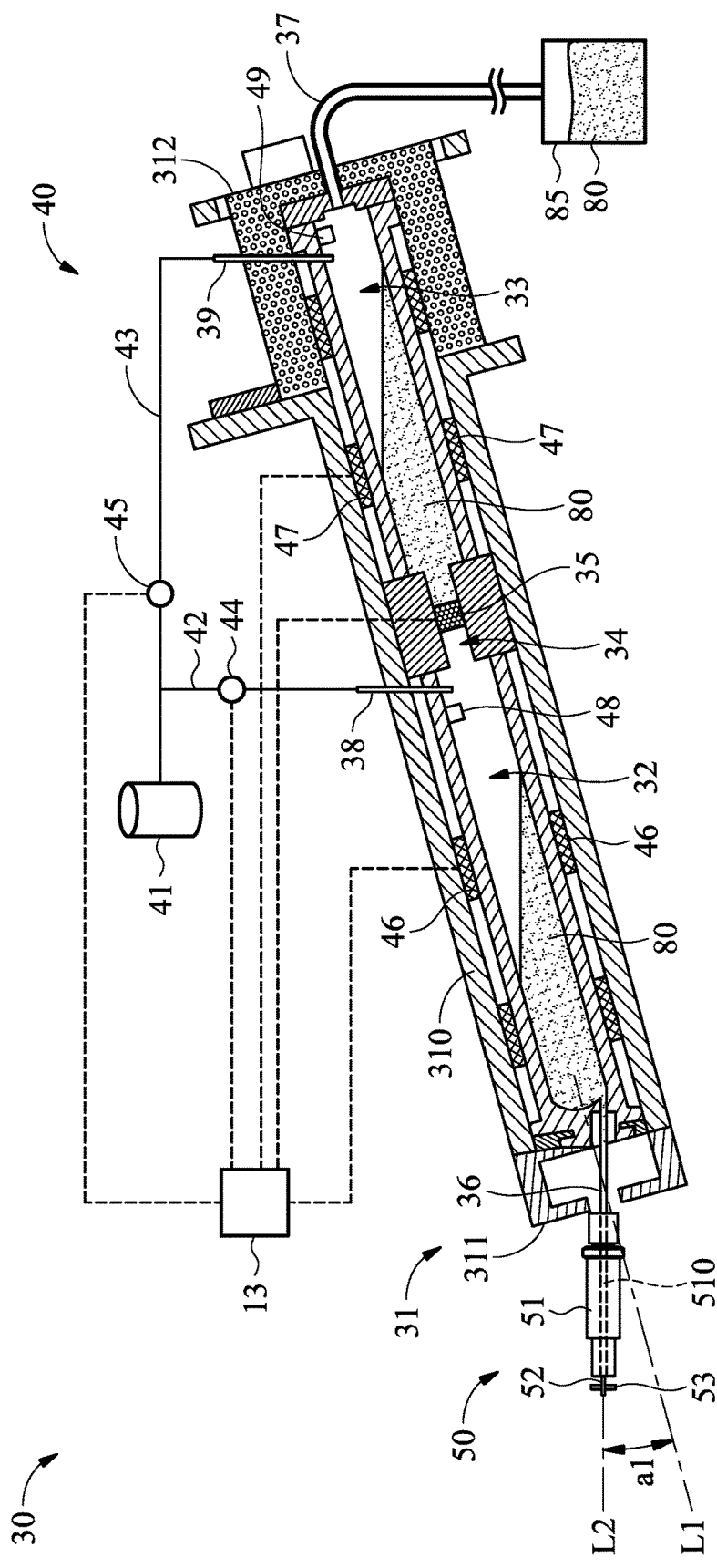
FIG. 3 is a cross-sectional view of partial elements of a light source including a target fuel generator, a number of gas-supply devices and a fuel-supply device, in accordance with some embodiments.

FIG. 3 shows a schematic view of the target fuel generator 30 connected to the fuel source 85 and the controller 13, in accordance with some embodiments. In some embodiments, the target fuel generator 30 includes a housing 31 for retaining a target fuel 80. The housing 31 extends along a first extending axis L1 from a first end 311 to a second end 312. A storage chamber 32 is positioned adjacent to the first end 311 of the housing 31, and a buffer chamber 33 is positioned adjacent to the second end 312 of the housing 31. The storage chamber 32 and the buffer chamber 33 arranged along the first extending axis L1 and communicates with each other with a channel 34.

In some embodiments, the housing 31 includes a fuel outlet 36 and a fuel inlet 37. The fuel outlet 36 penetrates the first end 311 of the housing 31 and communicates with the storage chamber 32 for the emission of the target fuel 80 retained in the storage chamber 32. The fuel inlet 37 penetrates the second end 312 of the housing 31 and communicates with buffer chamber 33 for the introduction of the target fuel 80 supplied from the fuel source 85 into the buffer chamber 33. However, it should be appreciated that many variations and modifications can be made to embodiments of the disclosure. The fuel inlet 37 and the fuel outlet 36 can be located at any other suitable positions of the housing 31 as long as they respectively communicate with to the storage chamber 32 and the buffer chamber 33.

In addition to the fuel outlet 36 and the fuel inlet 37, the housing 31 further includes a gas port 38 and a gas port 39 in certain embodiments. The gas port 38 communicates with the storage chamber 32, and the gas port 39 communicates with the buffer chamber 33. The gas ports 38 and 39 may be tube structures that allow pumping gas from a conditioner (which will described later) or exhaust gas from the interiors of the storage chamber 32 and the buffer chamber 33.

In some embodiments, the target fuel generator 30 further includes a valve mechanism 35 to control the flow of the target fuel 80 from the buffer chamber 33 to the storage chamber 32. The valve mechanism 35 may include a pneumatic valve or a solenoid valve and be connected to the channel 34 that connects the buffer chamber 33 to the storage chamber 32. The valve mechanism 35 may be electrically connected to the controller 13 and is operated in response to a control signal transmitted from the controller 13.

In some embodiments, the target fuel generator 30 further includes a nozzle 50 to supply the target fuel from the storage chamber 32 in the form of droplets 82. In some embodiments, the nozzle 50 includes a filter 51, a head 52, and a droplet actuating element 53. The filter 51 is configured to remove impurities in the target fuel 80 from the storage chamber 32. In some embodiments, a filter channel 510 is formed in the filter 51. One end of the filter channel 510 is connected to the fuel outlet 36 to receive the target fuel 80 from the storage chamber 32. In addition, the other end of the filter channel 510 is connected to the head 52 to supply the target fuel 80 into the head 52. A porous membrane (not shown in figures), as a fuel filter, is positioned in the filter channel 510 to remove impurities in some embodiments.

The head 52 may have a tube structure and is connected to the filter channel 510. The droplet actuating element 53 surrounds the head 52. The droplet actuating element 53 may include a piezoelectric material and is electrically connected to the controller 13. The droplet actuating element 53 produces a compressing pressure over the head 52 according to a control signal issued by the controller 13 so as to supply the droplets 82 (FIG. 2) with a predetermined mode.

For example, the controller 13 supplies a voltage to the droplet actuating element 53 at a given frequency, causing the droplet actuating element 53 to press the head 52 at the time of receiving the voltage and stop the pressing when no voltage is received. As a result, the head 52 may supply a plurality of droplets 82 (FIG. 2) in the form of microdroplets into the excitation zone 81 (FIG. 2). In some other embodiments, a droplet pitch between two neighboring droplets 82 and/or the diameter of the droplets 82 are controlled as a function of the frequency at which the voltage is supplied to the droplet actuating element 53.

In some embodiments, the nozzle 50, including the filter channel 510 and the head 52, extends along a second extending axis L2 that is not parallel with the first extending axis L1. An angle a1 formed between the first extending axis L1 and the second extending axis L2 is greater than zero. In certain embodiments, the angle a1 is in a range from about 160 degrees to about 170 degrees.

In some embodiments, the target fuel generator 30 further includes a conditioner 40 configured to control at least one environmental factor (e.g., gas pressure and temperate) in the storage chamber 32 and the buffer chamber 33. In cases where the conditioner 40 is used to control the gas pressure in the storage chamber 32 and the buffer chamber 33, the conditioner 40 includes a gas source 41, two gas lines 42 and 43, and two flow control members 44 and 45. The gas source 41 supplies a pumping gas, such as argon, into the storage chamber 32 via the gas line 42 and the gas port 38 to manipulate the gas pressure in the storage chamber 32. In addition, the gas source 41 supplies the pumping gas into the buffer chamber 33 via the gas line 43 and the gas port 39 to manipulate the gas pressure in the buffer chamber 33.

The two flow control members 44 and 45 are connected to the gas lines 42 and 43 to control the flow of the gas in the gas lines 42 and 43. The two flow control members 44 and 45 are electrically connected to the controller 13 and are operated in response to a control signal from the controller 13. The two flow control members 44 and 45 may include a pump and/or a valve (not shown in figures). The flow control members 44 and 45 may be operated to control the gas pressure at the storage chamber 32 and the buffer chamber 33 above a predetermined gas pressure to force the target fuel 80 flowing out of the storage chamber 32. For purpose of description, the flow control member 44 is referred to as downstream flow control member, the flow control member 45 is referred to as upstream flow control member.

In cases where the conditioner 40 is used to control the temperature of the storage chamber 32 and the buffer chamber 33, the conditioner 40 includes a number of heating members, such as downstream heating members 46 and upstream heating members 47. The downstream heating members 46 are connected to a segment of an outer wall 310 of the housing 31 that corresponding to the storage chamber 32. The upstream heating members 47 are connected to a segment of an outer wall 310 of the housing 31 that corresponding to the buffer chamber 33. The downstream heating members 46 and the upstream heating members 47 are electrically connected to the controller 13 and are operated in response to a control signal from the controller 13. The downstream heating members 46 and the upstream heating members 47 may include heating coils and be operated to heat the storage chamber 32 and the buffer chamber 33 at a temperature that is higher than a predetermined temperature, such as 250° C., to keep the target fuel in a fluid state.

In some embodiments, the conditioner 40 further includes a number of gas pressure sensors, such as gas pressure sensor 48 and 49, configured to detect gas pressure in the storage chamber 32 or the in the buffer chamber 33. For example, the gas pressure sensor 48 is positioned in the storage chamber 32 to detect the gas pressure in the storage chamber 32, and the gas pressure sensor 49 is positioned in the buffer chamber 33 to detect the gas pressure in the buffer chamber 33. In some alternative embodiments, the gas pressure sensors 48 and 49 are connected to the gas lines 42 and 43 to detect gas pressure in the gas lines 42 and 43. In some alternative embodiments, the gas pressure sensors 48 and 49 are omitted, the gas pressure in the storage chamber 32 and the buffer chamber 33 is accurately controlled by the downstream flow control member 44 and the upstream flow control member 45, and there is no need to detect the gas pressure in the storage chamber 32 and the buffer chamber 33.

Figure 4:
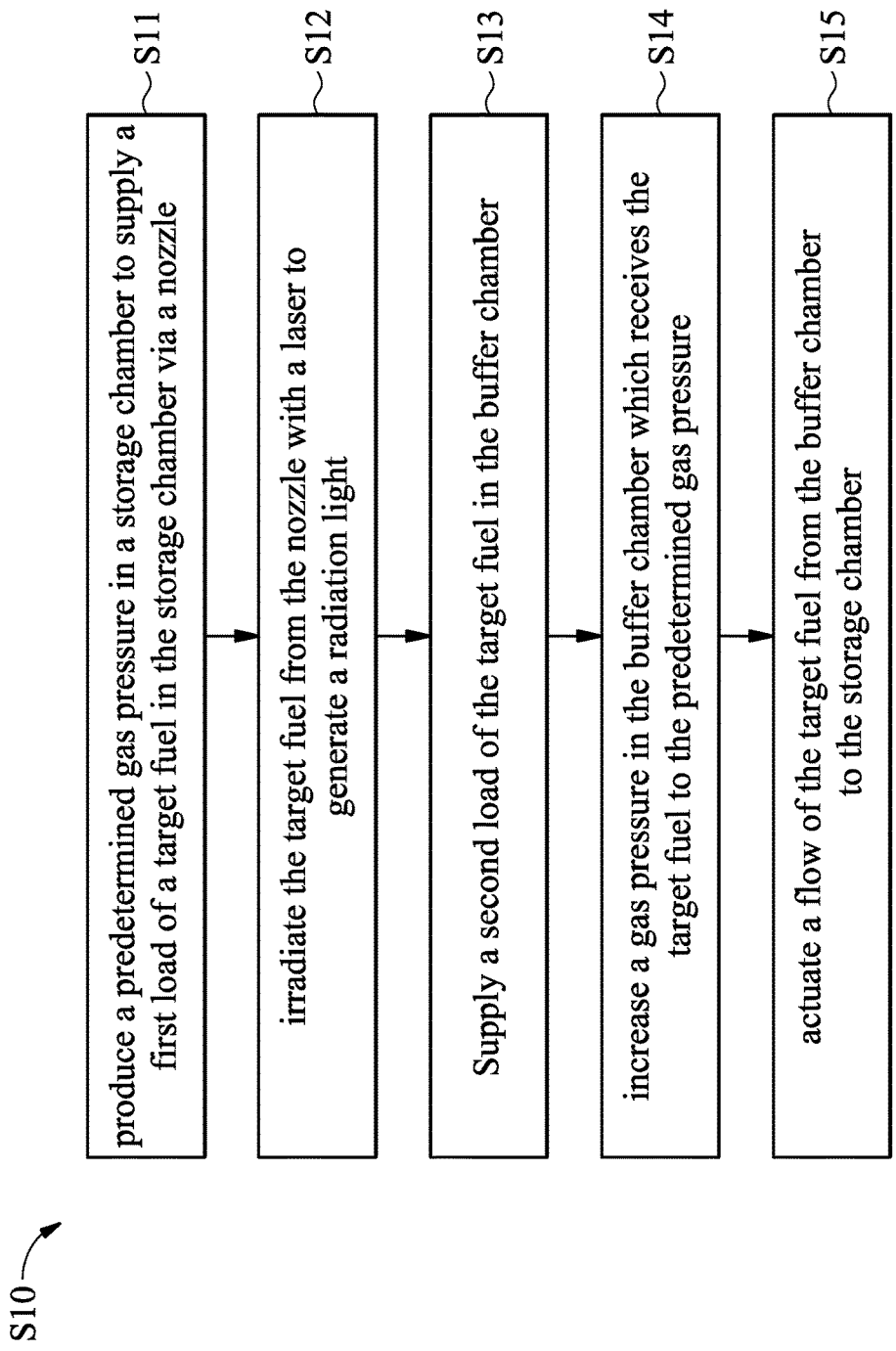
FIG. 4 is a flowchart of a method for generating a radiation light in a lithography exposure system, in accordance with some embodiments.

FIG. 4 is a flowchart of a method S10 for generating a radiation light in a lithography exposure system, in accordance with some embodiments. For illustration, the flow chart will be described along with the drawings shown in FIGS. 2 and 5-8. Some of the described stages can be replaced or eliminated in different embodiments.

Figure 5:
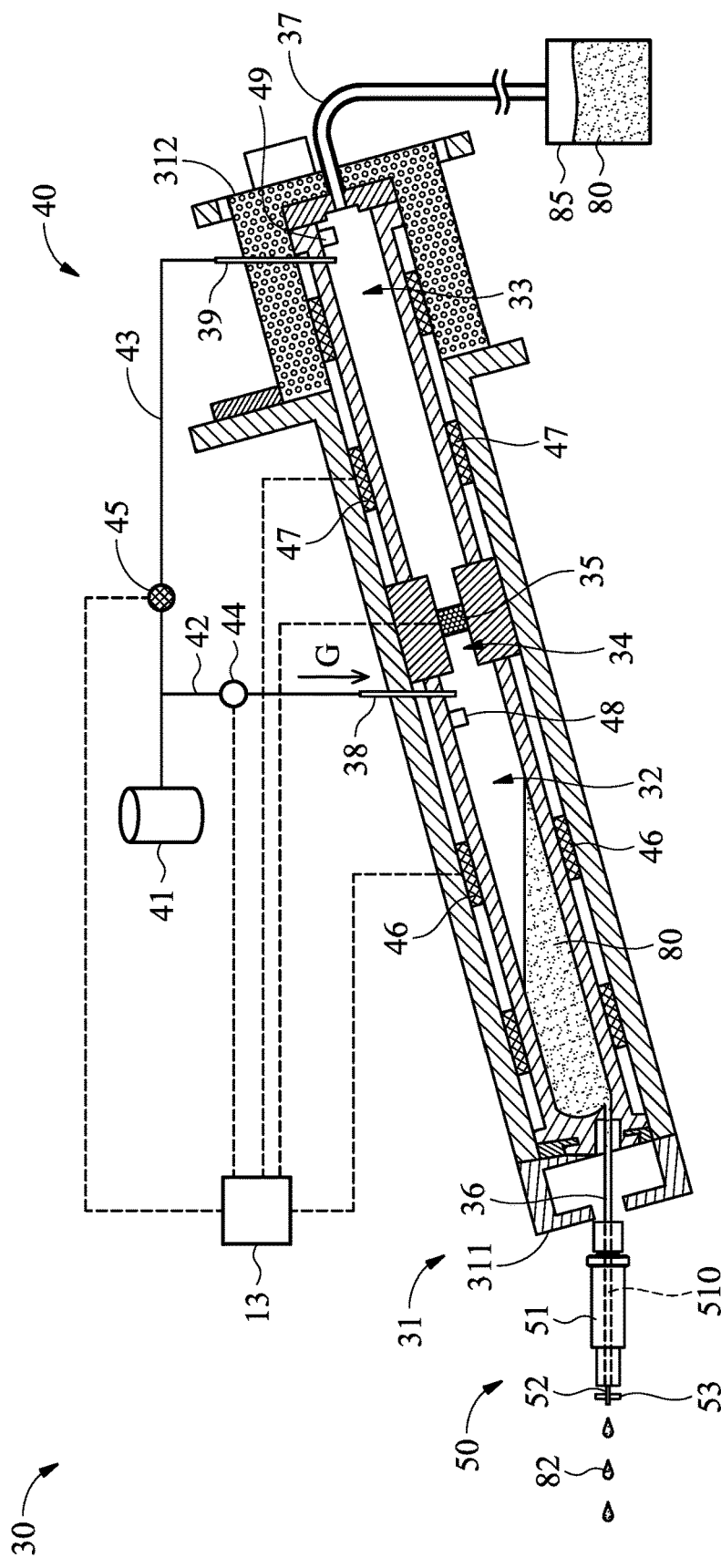
FIG. 5 is a cross-sectional view of partial elements of a target fuel generator as target fuel is generated by a storage chamber, in accordance with some embodiments.

The method S10 includes operation S11, in which a predetermined gas pressure in the storage chamber 32 is produced so as to supply the target fuel retained in the storage chamber 32 via the nozzle 50. In some embodiments, as shown in FIG. 5, a load of target fuel 80 is stored in the storage chamber 32. To supply the target fuel 80, a control signal is issued with the controller 13 to the downstream flow control member 44 to actuate the flow of a pumping gas G, such as hydrogen or argon, flow into the storage chamber 32.

The pumping gas G increases the gas pressure in the storage chamber 32 so as to force the target fuel 80 received in the storage chamber 32 out of the target fuel generator 30 in the form of droplets 82. In some embodiments, a flow velocity of the droplets 82 from the target fuel generator 30 is a function of the pressure of the pumping gas G in the target fuel generator 30. For example, the droplets 82 flow faster when the pressure of the pumping gas G in the storage chamber 32 is increased, and the droplets 82 flow slower when the pressure of the pumping gas G in the storage chamber 32 is reduced.

In embodiments, during the supply of the target fuel 80, at least one condition of the droplets 82 of the target fuel 80 is monitored and a detection signal is produced according to the monitoring result. For example, the droplet condition detector 71 of the monitoring device 70 (FIG. 2) produces an image or a video of the droplets 82 of the target fuel 80 and transmits data associated with the images or video to the analyzer 73. The analyzer 73 analyzes the image or the video and produces a detection signal to the controller 13. The detection signal may include a flow velocity of the droplets 82.

Afterwards, the detection signal is analyzed to determine if the detection signal is different from the preset value of the predetermined processing parameter. For example, in the cases where data associated with a flow velocity of the droplets 82 is produced, the calculated flow velocity is compared with preset value of flow velocity. When the calculated flow velocity is different from the preset value of the predetermined processing parameter, the pumping gas G supplied into the storage chamber 32 is adjusted by the controller 13 according to the calculated flow velocity so as to accurately modify the flow velocity of the droplets 82 until the detected flow velocity of the droplets 82 is the same as the predetermined flow velocity.

The method S10 further includes operation S12, in which the droplets 82 from the nozzle 50 are excited to generate radiation light. One method for exciting the droplets 82, in accordance with some embodiments, is described below.

In the beginning, as shown in FIG. 2, the first laser source 91 is used to generate the pre-pulse laser 92 to expand the droplets 82 at the first lighting position LP1. Before being irradiated by the pre-pulse laser 92, the droplets 82 have circular shape. After the droplets 82 are irradiated by the pre-pulse laser 92, a portion of the pre-pulse laser 92 is converted to kinetic energy to transform the droplets 82 to expanded targets 83 with pancake-shape.

Afterwards, the second laser source 95 is used to generate the main pulse laser 96 to excite the expanded targets 83 at the second lighting position LP2. The main pulse laser 96 heats the expanded targets 83 to a preset temperature. At the preset temperature, the target material 80 in the expanded targets 83 shed their electrons and become a plasma that emits light 84.

Figure 6:
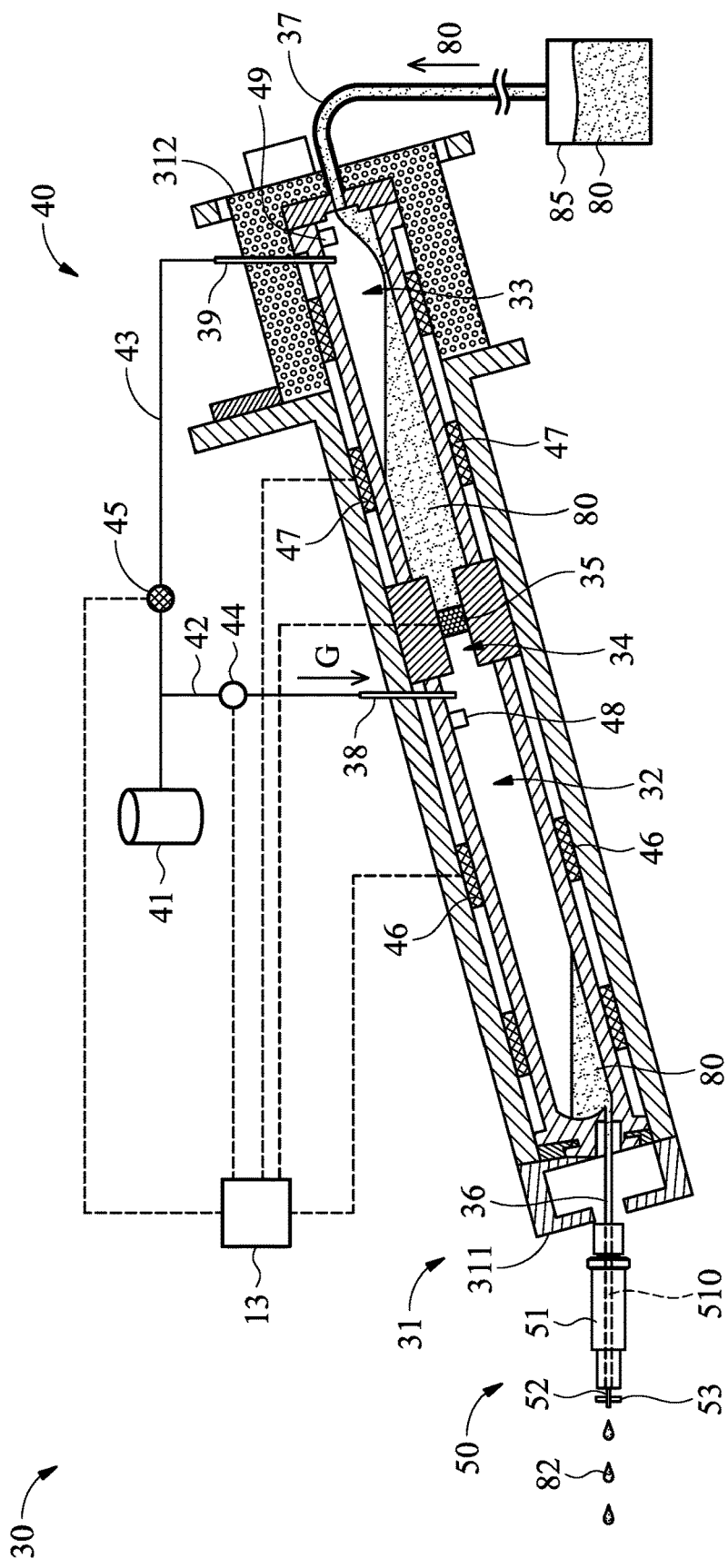
FIG. 6 is a cross-sectional view of partial elements of a target fuel generator as target fuel is generated by a storage chamber for a predetermined period and a buffer chamber is filled with a load of target fuels, in accordance with some embodiments.

The method S10 further includes operation S13, in which a load of target fuel 80 is supplied into the buffer chamber 33. In some embodiments, as shown in FIG. 6, after operation S11 is performed for a predetermined period, the volume of target fuel 80 in the storage chamber 32 is lowered. In order to fill another load of target fuel 80 into the storage chamber 32, operation S13 is performed before the target fuel 80 in the storage chamber 32 is drained. To supply the buffer chamber 33 with the target fuel 80, the vacant buffer chamber 33 is exhausted in advance to an ambient gas pressure. Afterwards, the target fuel 80 is delivered from the fuel source 85 into the buffer chamber 33 via the fuel inlet 37.

When the supply of target fuel 80 being supplied to the buffer chamber 33 is depleted, the buffer chamber 33 is secluded and sealed from an ambient surrounding. The top of the target fuel 80 in the buffer chamber 33 may be spaced from the fuel inlet 37 by a distance that is greater than about 6 cm. In some other embodiments, operation S13 is omitted. The target fuel 80 has already retained in the buffer chamber 33. One example of the absence of operation S13 will be described in the embodiment shown in FIGS. 9 and 10.

In some embodiments, when the target fuel 80 is stored in the buffer chamber 33, the buffer chamber 33 may be heated at a predetermined temperature, such as 250° C., by the heating member 47 to keep the target fuel in a fluid state. The heating member 47 may be operated to heat the buffer chamber 33 after the supply of the target fuel 80 from the fuel inlet 37. Alternatively, the heating member 47 may be operated to heat the buffer chamber 33 before the supply of the target fuel 80 from the fuel inlet 37. In some embodiments, before operation S13 is performed, there is some target fuel 80 left in the buffer chamber 33. Therefore, heating the buffer chamber 33 before the supply of the target fuel 80 would melt the left target fuel 80 in the buffer chamber 33 to facilitate the mixing of the left target fuel 80 and the new supplied target fuel 80 from the fuel inlet 37.

Figure 7:
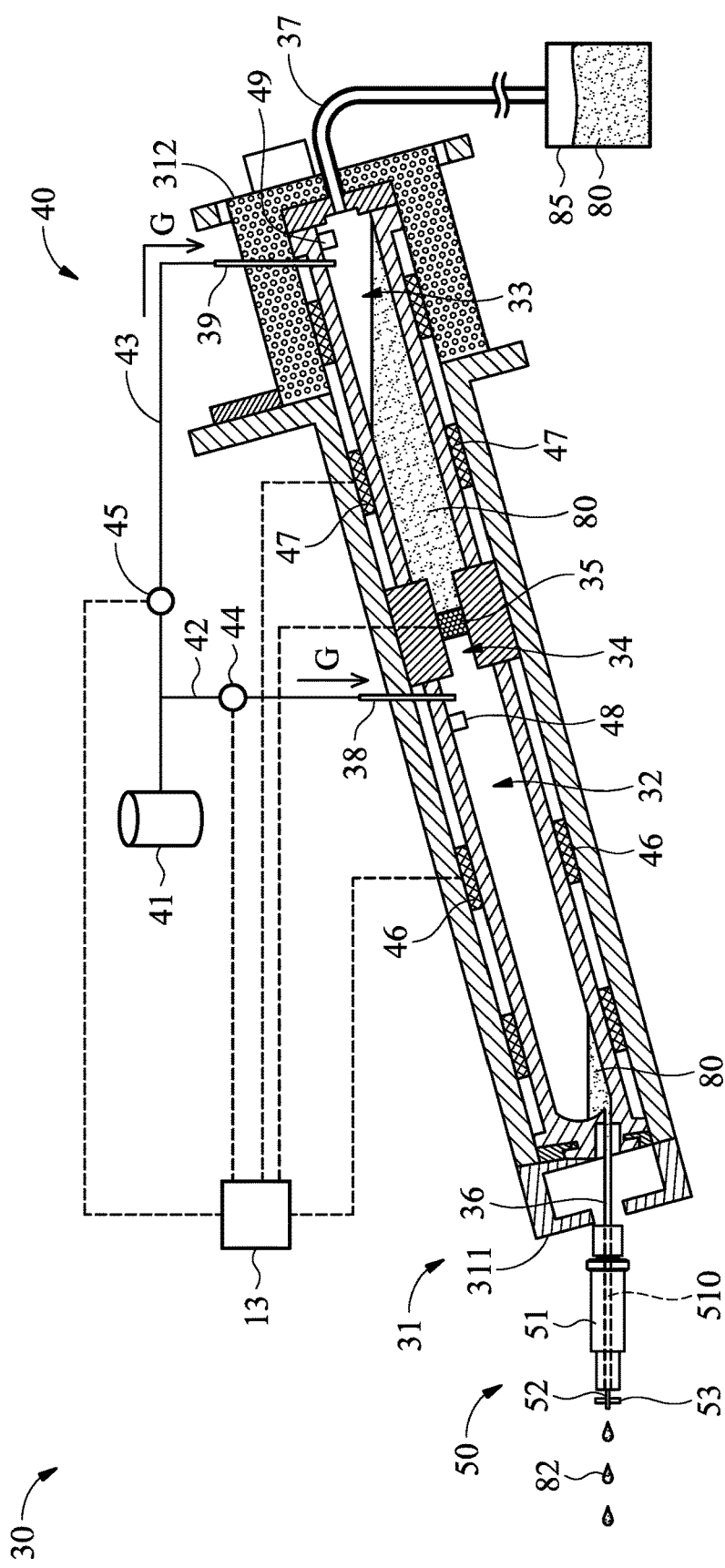
FIG. 7 is a cross-sectional view of partial elements of a target fuel generator as target fuel is delivered from a buffer chamber to a storage chamber, in accordance with some embodiments.

The method S10 further includes operation S14, in which gas pressure in the buffer chamber 33 that receives the target fuel 80 is increased to the predetermined gas pressure. In some embodiments, as shown in FIG. 7, when operation S13 is finished, a control signal is issued with the controller 13 to the upstream flow control member 45 to actuate the flow of a pumping gas G, such as argon, flow into the buffer chamber 33. The pumping gas G increases the gas pressure in the buffer chamber 33 to the predetermined gas pressure, which is the same as the gas pressure in the storage chamber 32.

In some embodiments, the gas pressure in the storage chamber 32 is dynamically adjusted to keep to the flow velocity of the droplets 82 meets the preset value. In order to make sure that the buffer chamber 33 has the same gas pressure as that of the storage chamber 32, the pressure sensor 48 is used to detect in real-time the gas pressure in the storage chamber 32 and sends back a detection signal according to the detected gas pressure in the storage chamber 32 to the controller 13. The controller 13 actuates a control signal to the upstream flow control member 45 in response to the detection signal from the pressure sensor 48, thereby increasing the gas pressure in the buffer chamber 33 the same as that in the storage chamber 32. In some other embodiments, there is no need to detect the gas pressure in the storage chamber 32. The controller 13 actuates a control signal to the upstream flow control member 45 according to the real-time processing parameters of the downstream flow control member 44.

Figure 8:
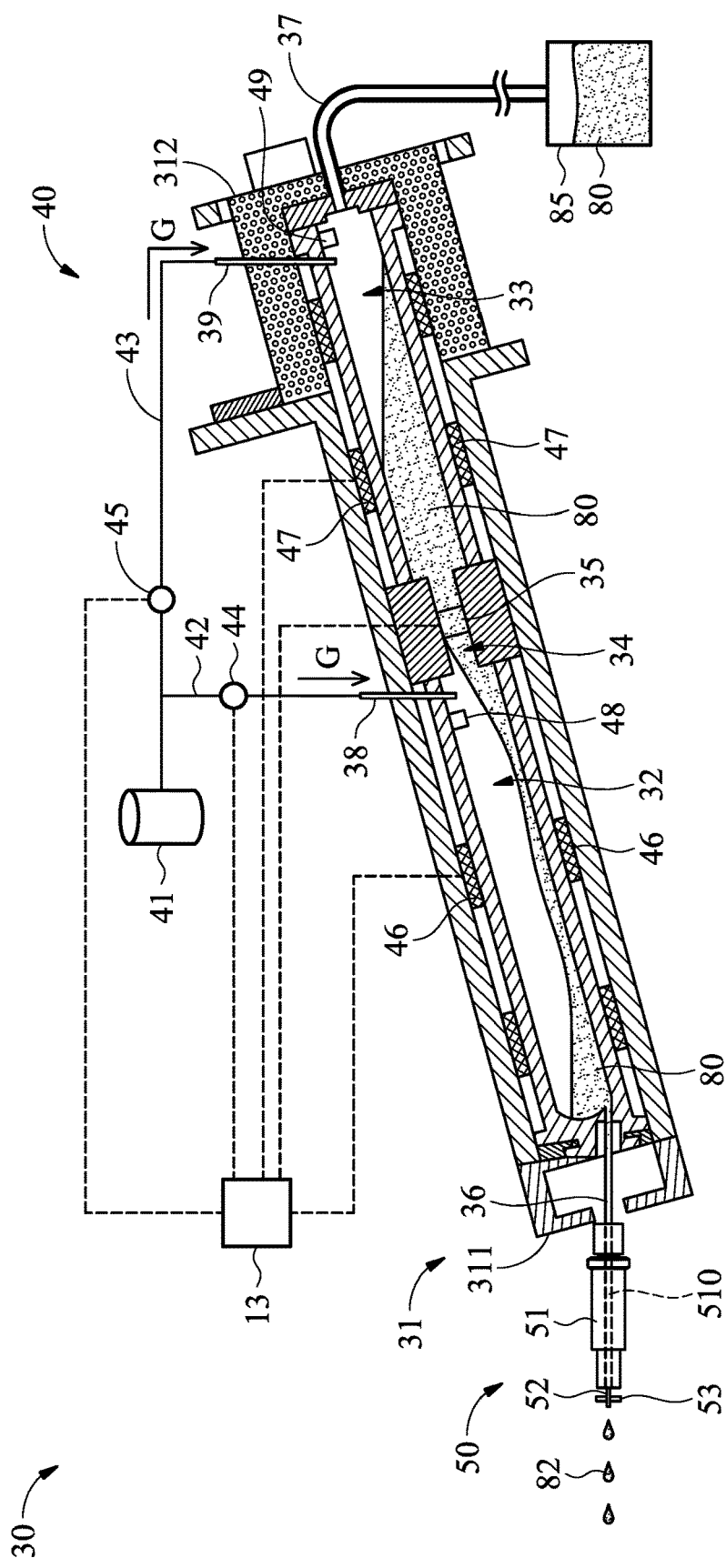
FIG. 8 is a cross-sectional view of partial elements of a target fuel generator as a storage chamber is refilled with a target fuel and a buffer chamber is running out of the target fuel, in accordance with some embodiments.

The method S10 further includes operation S15, in which the flow of the target fuel 80 from the buffer chamber 33 to the storage chamber 32 is actuated. In some embodiments, operation S15 is initiated once a pressure equalization of the storage chamber 32 and the buffer chamber 33 is established. For example, as shown in FIG. 8, the gas pressure in the buffer chamber 33 is detected by the gas pressure sensor 49, and the gas pressure sensor 49 sends back a detection signal according to the gas pressure in the buffer chamber 33 to the controller 13.

Afterwards, the controller 13 compares the detection signal from the gas pressure sensor 49 and the detection signal from the gas pressure sensor 48. When the results of this comparison show that the gas pressure in the storage chamber 32 and the buffer chamber 33 are equal, the controller 13 issues a control signal to turn on the valve mechanism 35 to actuate the flow of the target fuel 80 from the buffer chamber 33 to the storage chamber 32. Therefore, the storage chamber 32 is filled with another load of target fuel 80, and the supply of target fuel 80 via the nozzle 50 will not be interrupted.

In some alternative embodiments, the flow of the target fuel 80 from the buffer chamber 33 to the storage chamber 32 is not actuated even though the pressure equalization of the storage chamber 32 and the buffer chamber 33 is established and is postponed for a while until the other process is finished. For example, the flow of the target fuel 80 from the buffer chamber 33 to the storage chamber 32 is not actuated until the temperature of buffer chamber 33 is increased to the predetermined temperature. That is, the target fuel 80 received in the storage chamber 32 and the buffer chamber 33 are heated to the predetermined temperature before the flow of the target fuel 80 from the buffer chamber 33 to the storage chamber 32 is actuated. Another example is that the flow of the target fuel 80 from the buffer chamber 33 to the storage chamber 32 is actuated when a predetermined processing parameter shows that the target fuel 80 in the storage chamber 32 has run out or has nearly run out.

In some embodiments, in operation S15, the gas pressure in the buffer chamber 33 is modulated so as to control the flow rate of the flow of the target fuel from the buffer chamber 33 to the storage chamber 32. For example, the gas pressure in the buffer chamber 33 is continuously increased after the pressure equalization of the storage chamber 32 and the buffer chamber 33 is established. The gas pressure in the buffer chamber 33 may be increased to a specific ratio of the gas pressure in the storage chamber 32 so as to increase the flow rate of the target fuel being supplied to the storage chamber. As a result, the need time for refilling the storage chamber is reduced.

In some embodiments, operation S15 is terminated after operation S15 is performed for a predetermined period. In some embodiments, when operation S15 is terminated, the flow of the target fuel from the buffer chamber to the storage chamber is stopped. Afterwards, the gas in the buffer chamber 33 is exhausted and reduced below the predetermined gas pressure, and another load of target fuel 80 is refilled into the buffer chamber 33 from the fuel source 85. The predetermined period may be determined according to an archive data. The archive data shows the time needed for moving all of the target fuel 80 retained in the buffer chamber 33 to the storage chamber 32.

Figure 9:
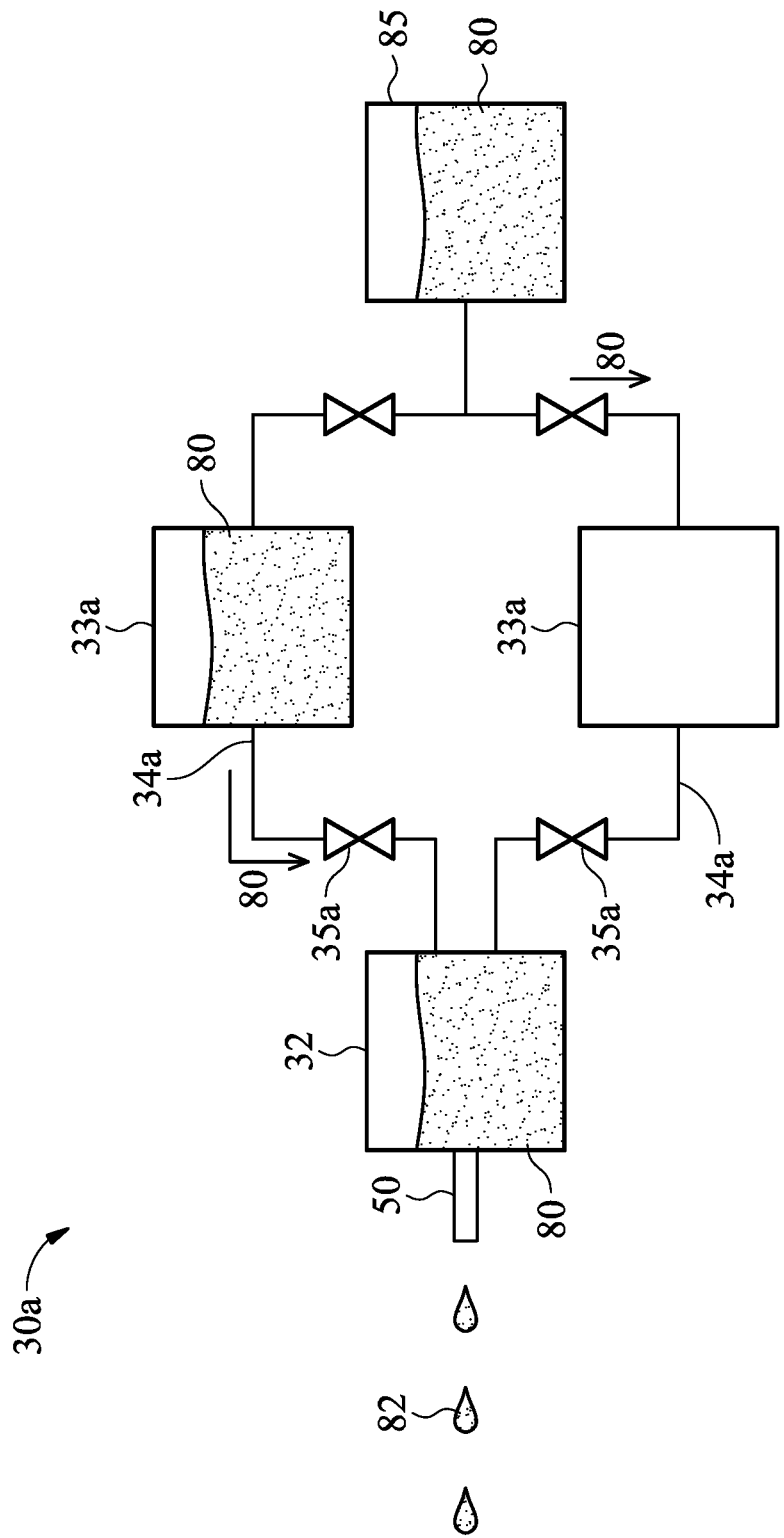
FIG. 9 is a block diagram of a target fuel generator with two buffer chambers connecting to a fuel source, in accordance with some embodiments.

FIG. 9 is a block diagram of a target fuel generator 30a, in accordance with some embodiments. In the embodiments, elements that are similar to those shown in FIG. 3 are provided with the same or similar reference numbers, and the features thereof are not reiterated in the interests of brevity. Differences between the target fuel generator 30a and the target fuel generator 30 include the target fuel generator 30a including two buffer chambers 33a.

In some embodiments, the two buffer chambers 33a are connected to the storage chamber 32 via two channels 34a, and two flow control member 35a are connected to the channels 34a to control the flow of the target fuel 80 from the two buffer chambers 33a. In addition, the two buffer chambers 33a are connected to the fuel source 85 via two fuel inlets 37. For purpose of illustration, the buffer chamber 33a shown in the top of FIG. 9 is referred to as a first buffer chamber, and the buffer chamber 33a shown in the bottom of FIG. 9 is referred to as a second buffer chamber.

In operation, the first and second buffer chambers are alternately used to supply the target fuel 80 into the storage chamber 32. For example, while the first buffer chamber supplies the target fuel 80 into the storage chamber 32, another load of target fuel 80 is refilled into the second buffer chamber. After the first buffer chamber runs out of the target fuel 80, the second buffer chamber is used to supply the target fuel 80. While at the same time, another load of target fuel 80 is supplied into the first buffer chamber from the fuel source 85. As a result, the supply of the target fuel 80 into the storage chamber 32 can be continue and there is no need to wait for the filling of the target fuel 80 into the buffer chamber and the increase of the gas pressure in the buffer chamber.

Figure 10:
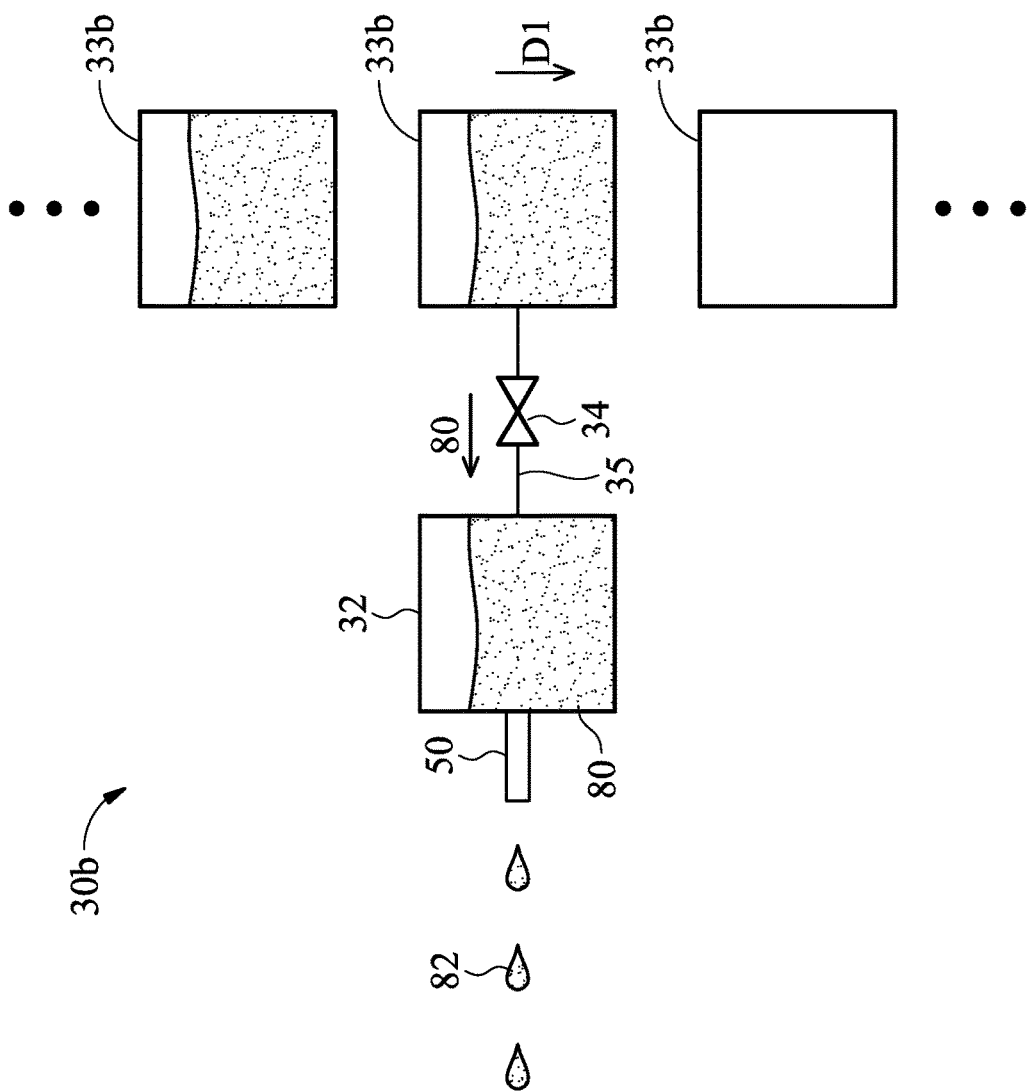
FIG. 10 is a block diagram of a target fuel generator with a number of buffer chambers, in accordance with some embodiments.

FIG. 10 is a block diagram of a target fuel generator 30b, in accordance with some embodiments. In the embodiments, elements that are similar to those shown in FIG. 3 are provided with the same or similar reference numbers, and the features thereof are not reiterated in the interests of brevity. Differences between the target fuel generator 30b and the target fuel generator 30 include the target fuel generator 30b including a number of buffer chambers 33b.

In some embodiments, the buffer chambers 33b are arranged in order and the storage chamber 32 is connected to one of the buffer chambers 33b at one time. The buffer chambers 33b may be moved along the direction as indicated by the arrow D1 shown in FIG. 10. For example, the buffer chambers 33b are positioned at a rotation plate (not shown), and the one of the buffer chambers 33b that connects to the storage chamber 32 is changed when the rotation plate is rotated.

In operation, each of the buffer chambers 33b is filled with the target fuel 80 in advance, and one of the buffer chambers 33b is connected to the storage chamber 32 to supply the target fuel 80 into the storage chamber 32. Once the currently used buffer chamber 33b runs out of target fuel 80, another buffer chamber 33b is connected to the storage chamber 32 to supply target fuel 80. As a result, the supply of target fuel 80 into the storage chamber 32 can be continued and there is no need to wait for the filling of the target fuel 80 into the buffer chamber. In addition, since all of the buffer chambers 33b are filled with the target fuel 80 in advance, the fuel source for filling the buffer chamber is be omitted.

Figure 11:
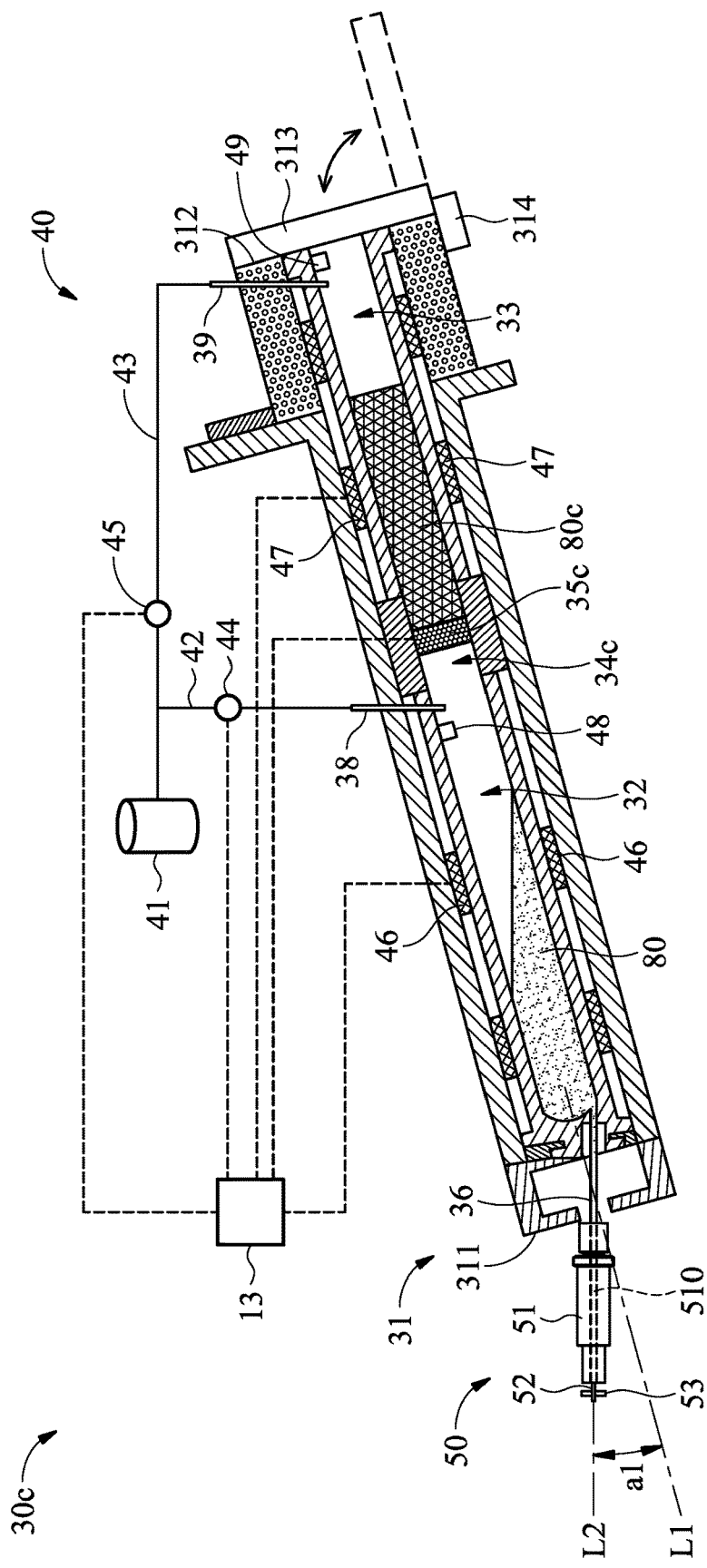
FIG. 11 is a cross-sectional view of partial elements of a light source, in accordance with some embodiments.

FIG. 11 is a cross-sectional view of a target fuel generator 30c, in accordance with some embodiments. In the embodiments, elements that are similar to those shown in FIG. 3 are provided with the same or similar reference numbers, and the features thereof are not reiterated in the interests of brevity. Differences between the target fuel generator 30c and the target fuel generator 30 include the omission of gas inlet 37 and the target fuel generator 30c further including a cover 313. The cover 313 is connected to the second end 312 of the housing 31. The cover 313 may be connected to the housing 31 by a suitable connecting element 314, such as hinge structure 314, such that the cover 313 can be moved relative to the housing 31 between a closed position (shown in solid line) and an open position (shown in dashed line). In the open position, target fuel 80c which has a solid state can be inserted into the buffer chamber 33.

In addition, differences between the target fuel generator 30c and the target fuel generator 30 include the channel 34 being replaced by channel 34c, and the valve mechanism being replaced by the valve mechanism 35c. The channel 34c has a width that is as the same as the width of the buffer chamber 33 and the storage chamber 32. The valve mechanism 35c may include a latch. The valve mechanism 35 is configured to control a movement of the target fuel 80c from the buffer chamber 33 to the storage chamber 32.

In operation, the cover 313 is arranged at the closed position, and the valve mechanism 35c is switched off. When the target fuel 80 in the storage chamber 32 is depleted, the valve mechanism 35c is switched on to allow the solid target fuel 80c to move into the storage chamber 32, and the solid target fuel 80c is melt in the storage chamber 32 and ready to be used. The target fuel 80c formed in solid state may be pre-heated in the buffer chamber 33 to a temperature below the melting point, so as to reduce the time for melting the target fuel 80c. However, it should be appreciated that many variations and modifications can be made to embodiments of the disclosure. The solid target fuel 80c in the buffer chamber 33 may be melt to be transferred into liquid state before being delivered into the storage chamber 32. After the target fuel 80c is moved into the storage chamber 32, the valve mechanism 35 is switched off, and the cover 313 is arranged at the open position to allow another new solid target fuel 80c to be inserted into the buffer chamber 33.

Embodiments of a method for generating a radiation light in a lithography exposure process are provided. The storage chamber is refilled with another load of target fuel before the running out of the previously deposited target fuel, and the process for exciting the droplet of the target fuel by the laser and emitting the radiation light to expose the photoresist formed on the semiconductor wafer persists. As a result, the throughput of the lithography exposure system is increased because the lithography exposure system does not require frequent downtime for maintenance or repair.

In accordance with some embodiments, a lithography exposure system is provided. The lithography exposure system includes a buffer chamber configured to receive target fuel. The lithography exposure system further includes a storage chamber connected to the buffer chamber and configured to receive the target fuel from the buffer chamber. The lithography exposure system also includes a valve mechanism configured to control the flow of the target fuel from the buffer chamber to the storage chamber. In addition, the lithography exposure system includes a nozzle connected to the storage chamber and configured to supply the target fuel.

In accordance with some embodiments, a lithography exposure system is provided. The lithography exposure system includes a target fuel generator. The target fuel generator includes a buffer chamber, a storage chamber and a nozzle arranged in order to guide the flow of target fuel in the target fuel generator. The buffer chamber is selectively connected to the storage chamber. The lithography exposure system further includes a controller. The controller is configured to control a gas pressure in the storage chamber and a gas pressure in the buffer chamber having the same level. The controller is further configured to control the flow of the target fuel from the buffer chamber to the storage chamber.

In accordance with some embodiments, a method for generating a radiation light in a lithography exposure system. The method includes producing a predetermined gas pressure in a storage chamber to supply a first load of a target fuel in the storage chamber via a nozzle. The method further includes irradiating the target fuel from the nozzle with a laser to generate the radiation light. The method also includes increasing the gas pressure in the buffer chamber that receives a second load of target fuel to the predetermined gas pressure. In addition, the method includes actuating the flow of the target fuel from the buffer chamber to the storage chamber after the predetermined gas pressure is produced in the buffer chamber.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A target fuel generator, comprising:
   a buffer chamber configured to receive a target fuel;
   a storage chamber connected to the buffer chamber and configured to receive the target fuel from the buffer chamber;
   a valve mechanism configured to control a flow of the target fuel from the buffer chamber to the storage chamber;
   a nozzle connected to the storage chamber and configured to supply the target fuel; and
   a housing, wherein the buffer chamber, the storage chamber, and the valve mechanism are positioned within the housing.

2. The target fuel generator as claimed in claim 1, further comprising heating members connected to an outer wall of the buffer chamber and an outer wall of the storage chamber, wherein the heating members are configured to control the buffer chamber and the storage chamber having the same temperature.

3. The target fuel generator as claimed in claim 1, further comprising:
   a gas source in communication with the buffer chamber and the storage chamber; and
   two gas pressure sensors each positioned in the buffer chamber and the storage chamber and configured to detect gas pressure in the buffer chamber and the storage chamber;
   wherein the gas source supplies gas into to the buffer chamber and the storage chamber based on the gas pressure detected by the two gas pressure sensors to control the buffer chamber and the storage chamber having the same gas pressure.

4. The target fuel generator as claimed in claim 1, further comprising a fuel source positioned outside the housing and connected to the buffer chamber for supplying the target fuel into the buffer chamber.

5. The target fuel generator as claimed in claim 1, wherein the buffer chamber and the storage chamber are arranged along a first axis, and the nozzle extends along a second axis, wherein the first axis intersects with the second axis at an angle that is in a range from about 160 degrees to about 170 degrees.

6. The target fuel generator as claimed in claim 1, further comprising a gas pressure sensor connected to the buffer chamber to detect the gas pressure in the buffer chamber.

7. The target fuel generator as claimed in claim 1, wherein the valve mechanism is connected to a channel that connects the buffer chamber to the storage chamber, and the channel has a width that is the same as a width of the buffer chamber and a width of the storage chamber.

8. A lithography exposure system, comprising:
   a target fuel generator comprising a buffer chamber, a storage chamber and a nozzle arranged in order to guide a flow of a target fuel, wherein the buffer chamber is selectively connected to the storage chamber;
   a laser generator configured to generate a laser to hit the target fuel supplied by the target fuel generator; and
   a controller configured to:
   control a gas pressure in the storage chamber and a gas pressure in the buffer chamber having the same level; and
   control the flow of the target fuel from the buffer chamber to the storage chamber after the gas pressure in the storage chamber and the gas pressure in the buffer chamber have the same level.

9. The lithography exposure system as claimed in claim 8, wherein the target fuel generator further comprises an upstream flow control member and a downstream flow control member respectively connected to the buffer chamber and the storage chamber;
   wherein the controller actuates the upstream flow control member and the downstream flow control member to pump gas into the buffer chamber and the storage chamber to produce a predetermined gas pressure in the buffer chamber and in the storage chamber.

10. The lithography exposure system as claimed in claim 9, wherein the target fuel generator further comprises two gas pressure sensors each connected to the buffer chamber and the storage chamber and configured to detect the gas pressure in the buffer chamber and the gas pressure in the storage chamber;
   wherein the controller is configured to:
   compare the gas pressures detected by the two gas pressure sensors; and
   control the upstream flow control member and the downstream flow control member to pump gas into the buffer chamber and the storage chamber based on a result of the comparison to have the same gas pressure in the buffer chamber and the storage chamber.

11. The lithography exposure system as claimed in claim 8, wherein the target fuel generator further comprises an upstream heater and a downstream heater respectively connected to the buffer chamber and the storage chamber;
   wherein the controller actuates the upstream heater and the downstream heater to heat the buffer chamber and the storage chamber to maintain the target fuel in the buffer chamber and the storage chamber at a predetermined temperature.

12. The lithography exposure system as claimed in claim 8, wherein the target fuel generator further comprises a fuel source connected to the buffer chamber for supplying the target fuel into the buffer chamber.

13. The lithography exposure system as claimed in claim 8, wherein the buffer chamber and the storage chamber are arranged along a first axis, and the nozzle extends along a second axis, wherein the first axis intersects with the second axis at an angle that is in a range from about 160 degrees to about 170 degrees.

14. The lithography exposure system as claimed in claim 8, wherein the target fuel generator further comprises a valve mechanism connected between the buffer chamber and the storage chamber;
   wherein after the gas pressure in the storage chamber and the gas pressure in the buffer chamber have the same level, the controller connects the buffer chamber to the storage chamber by turning on the valve mechanism to allow the flow of the target fuel from the buffer chamber to the storage chamber.

15. The lithography exposure system as claimed in claim 8, wherein the target fuel generator further comprises a gas pressure sensor connected to the buffer chamber to detect the gas pressure in the buffer chamber.

16. A method for generating a radiation light in a lithography exposure system, comprising:
   producing a predetermined gas pressure in a storage chamber to supply a first load of a target fuel in the storage chamber via a nozzle;
   irradiating the target fuel from the nozzle with a laser to generate the radiation light;
   increasing a gas pressure in a buffer chamber which receives a second load of the target fuel to the predetermined gas pressure; and
   actuating a flow of the target fuel from the buffer chamber to the storage chamber after the predetermined gas pressure is produced in the buffer chamber.

17. The method as claimed in claimed 16, further comprising heating the storage chamber and the buffer chamber for maintaining the target fuel received in the storage chamber and the buffer chamber in a fluid state.

18. The method as claimed in claimed 17, wherein the target fuel received in the storage chamber and the buffer chamber are heated at the same temperature before the flow of the target fuel from the buffer chamber to the storage chamber is actuated.

19. The method as claimed in claimed 16, further comprising:
   terminating the flow of the target fuel from the buffer chamber to the storage chamber;
   decreasing the gas pressure in the buffer chamber below the predetermined gas pressure; and
   supplying a third load of target fuel into the buffer chamber from a fuel source.

20. The method as claimed in claimed 16, wherein the gas pressure in the buffer chamber is increased while the supply of the target fuel from the storage chamber is performed.

* * * * *